(12) United States Patent
Huang et al.

(10) Patent No.: US 7,768,071 B2
(45) Date of Patent: Aug. 3, 2010

(54) STABILIZING BREAKDOWN VOLTAGES BY FORMING TUNNELS FOR ULTRA-HIGH VOLTAGE DEVICES

(75) Inventors: Eric Huang, Jhubei (TW); Tsung-Yi Huang, Hsin-Chu (TW); Fu-Hsin Chen, Jhudong Township (TW); Chyi-Chyuan Huang, Taipei (TW); Puo-Yu Chiang, Su-ao Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 196 days.

(21) Appl. No.: 12/170,285

(22) Filed: Jul. 9, 2008

(65) Prior Publication Data

US 2010/0006933 A1    Jan. 14, 2010

(51) Int. Cl.
*H01L 23/62* (2006.01)
(52) U.S. Cl. .................. 257/355; 257/335; 257/354; 257/E21.427; 257/E29.255
(58) Field of Classification Search ................ 257/370, 257/342–346, 335–336; 438/197, 286, 281–283, 438/545–546
See application file for complete search history.

(56) References Cited

U.S. PATENT DOCUMENTS

| | | | |
|---|---|---|---|
| 5,306,652 A | | 4/1994 | Kwon et al. |
| 6,486,034 B1 | | 11/2002 | Huang et al. |
| 6,713,331 B2 | | 3/2004 | Nishibe et al. |
| 7,202,531 B2 * | | 4/2007 | Imahashi et al. ............ 257/355 |
| 7,508,032 B2 * | | 3/2009 | Chiang et al. ............... 257/345 |
| 7,576,391 B2 * | | 8/2009 | Williams et al. ............ 257/335 |
| 2008/0265292 A1 * | | 10/2008 | Huang et al. ................ 257/288 |

OTHER PUBLICATIONS

Imam, M., et al., "Design and Optimization of Double-RESURF High-Voltage Lateral Devices for a Manufacturable Process," IEEE Transactions on Electron Devices, vol. 50, No. 7, Jul. 2003, pp. 1697-1701.

Kim, M.-H., et al., "A Low On- Resistance 700V Charge Balanced LDMOS with Intersected WELL Structure.," ESSDERC 2002, pp. 367-370.

Quddus, M. T., et al., "Drain Voltage Dependence of On Resistance in 700V Super Junction LDMOS Transistor," Proceedings of 2004 International Symposium on Power Semiconductor Devices & ICs, Kitakyushu, pp. 201-204.

Disney, D. R., et al., "A New 800V Lateral MOSFET with Dual Conduction Paths," Proceedings of 2001 International Symposium on Power Semiconductor Devices & ICs, Osaka, pp. 399-402.

(Continued)

*Primary Examiner*—Dung A. Le
(74) *Attorney, Agent, or Firm*—Slater & Matsil, L.L.P.

(57) ABSTRACT

A semiconductor structure includes a semiconductor substrate of a first conductivity type; a pre-high-voltage well (pre-HVW) in the semiconductor substrate, wherein the pre-HVW is of a second conductivity type opposite the first conductivity type; a high-voltage well (HVW) over the pre-HVW, wherein the HVW is of the second conductivity type; a field ring of the first conductivity type occupying a top portion of the HVW; and a tunnel of the first conductivity type in the pre-HVW and the HVW, and electrically connecting the field ring and the semiconductor substrate.

19 Claims, 12 Drawing Sheets

OTHER PUBLICATIONS

Hossain, Z., et al., "Field-Plate Effects on the Breakdown Voltage of an Integrated High-Voltage LDMOS Transistor," Proceedings of 2004 International Symposium on Power Semiconductor Devices & ICs, Kitakyushu, pp. 237-240.

Nezar, A., et al., "Breakdown Voltage in LDMOS Transistors Using Internal Field Rings," IEEE Transactions on Electron Devices, vol. 38, No. 7, Jul. 1991, pp. 1676-1680.

* cited by examiner

STABILIZING BREAKDOWN VOLTAGES BY FORMING TUNNELS FOR ULTRA-HIGH VOLTAGE DEVICES

CROSS-REFERENCE TO RELATED APPLICATION

The present application is related to commonly-assigned U.S. patent application Ser. No. 11/581,178, filed on Oct. 13, 2006, and entitled "Lateral Power MOSFET with High Breakdown Voltage and Low On-Resistance," which application is hereby incorporated herein by reference.

TECHNICAL FIELD

Ultra-high voltage metal-oxide-semiconductor field effect transistors (MOSFET) were typically fabricated with coplanar drain and source regions. FIG. 1A shows an ultra-high voltage MOSFET device 100 in the prior art. Device 100 is formed on a p-type substrate 101, and another p-layer 113 is epitaxially grown on substrate 101. High-voltage p-well 115 is adjacent high-voltage n-well 103 in the epitaxially grown p-layer 113. N+ source 117 is positioned in the high-voltage p-well 115, and N+ drain 105 is positioned in high-voltage n-well 103. Gate dielectric 111 and gate electrode 110 extend from over the N+ source 117 to over a portion of the field oxide 107. Device 100 also includes P+ pickup region 119 located in the high-voltage p-well 115. Applying a positive voltage to the gate electrode 110 induces a current to flow through the channel from the N+ source 117 into the high-voltage n-well 103, which current is collected at the N+ drain 105.

A problem with this type of ultra-high voltage MOSFET is that it cannot maintain a low on-resistance when a high voltage is applied on the ultra-high voltage MOSFET. The on-resistance affects the power transformed into heat as the current travels through the device. The greater the on-resistance of the device, the less efficient the device. Accordingly, it is desirable to reduce this resistance as much as possible for a more efficient device.

FIG. 1B illustrates another device 150 known in the prior that is designed to mitigate this problem. Device 150 is similar to device 100 of FIG. 1A, wherein like reference numerals are used to refer to like elements, except field ring 109 has been added. Field ring 109 works to reduce the surface electrical field and improves the depletion capability of the drift region. As a result, the doping concentration of the drift region can be increased and the on-resistance of the device 150 can be reduced compared to that of device 100.

The breakdown voltages of the prior art device 100 (shown in FIG. 1A) and the prior art device 150 (shown in FIG. 1B) are still not satisfactory. As is known in the art, devices can only be operated at voltages lower than the respective breakdown voltages. When a voltage greater than the breakdown voltage is applied on devices such as device 100 and device 150, catastrophic and irreversible damages occur to the devices, rendering the devices commercially useless and requiring the devices to be replaced. Accordingly, increasing the breakdown voltage is highly desirable.

In addition to the above-discussed problems, the breakdown voltages of conventional UHV MOSFETs are not stable. For example, even formed using a same process flow, the breakdown voltages of UHV MOSFETs may range from about 650 volts to over about 800 volts. This puts an upper limit to the usage of the UHV MOSFETs to below 650 volts.

Accordingly, an improved ultra-high voltage MOSFET is needed for a reduced on-resistance, a higher breakdown voltage, and an improved stability.

SUMMARY OF THE INVENTION

These and other problems are generally solved or circumvented, and technical advantages are generally achieved, by embodiments of the present invention that allow for an extended drift region in a ultra-high voltage MOSFET that has a reduced on-resistance and an increased breakdown voltage when the device is placed under high voltage.

In accordance with one aspect of the present invention, a semiconductor structure includes a semiconductor substrate of a first conductivity type; a pre-high-voltage well (pre-HVW) in the semiconductor substrate, wherein the pre-HVW is of a second conductivity type opposite the first conductivity type; a high-voltage well (HVW) over the pre-HVW, wherein the HVW is of the second conductivity type; a field ring of the first conductivity type occupying a top portion of the HVW; and a tunnel of the first conductivity type in the pre-HVW and the HVW, and electrically connecting the field ring and the semiconductor substrate.

In accordance with another aspect of the present invention, a semiconductor structure includes a semiconductor substrate of a first conductivity type; a pre-HVW in the semiconductor substrate, wherein the pre-HVW is of a second conductivity type opposite the first conductivity type; a HVW over and contacting the pre-HVW, wherein the HVW is of the second conductivity type; a plurality of tunnels of the first conductivity type extending from a top surface of the HVW to a bottom surface of the pre-HVW, wherein each of the plurality of tunnels is encircled by the pre-HVW and the HVW; and a field ring in the HVW and occupying a top portion of the HVW, wherein the field ring is of the first conductivity type; a drain region in the HVW; an insulation region over the field ring; a gate electrode over a portion of the insulation region; and a source region on an opposite side of the gate electrode than the drain region, wherein the source region and the drain region are of the second conductivity type.

In accordance with yet another aspect of the present invention, a semiconductor structure includes a semiconductor substrate of a first conductivity type; a pre-HVW in the semiconductor substrate, wherein the pre-HVW is of a second conductivity type opposite the first conductivity type; a HVW over and contacting the pre-HVW, wherein the HVW is of the second conductivity type; a field ring of the first conductivity type in, and occupying a top portion of, the HVW, wherein each of the pre-HVW, the HVW and the field ring includes a linear region and a curvature region; a tunnel of the first conductivity type extending from a top surface of the HVW to a bottom surface of the pre-HVW, and physically connecting the field ring and the semiconductor substrate; a drain region in the HVW; an insulation region over and contacting the field ring; a gate electrode over a portion of the insulation region; and a source region on an opposite side of the gate electrode than the drain region, wherein the source region and the drain region are of the second conductivity type.

In accordance with yet another aspect of the present invention, a method of forming a semiconductor structure includes providing a semiconductor substrate of a first conductivity type; forming a pre-HVW in the semiconductor substrate, wherein the pre-HVW is of a second conductivity type opposite the first conductivity type; forming a HVW over the pre-HVW, wherein the HVW is of the second conductivity type; forming a tunnel of the first conductivity type extending from a top surface of the HVW to a bottom surface of the pre-HVW; and forming a field ring occupying a top portion of the HVW, wherein the field ring is of the first conductivity type, and is in physical contact with the tunnel.

In accordance with yet another aspect of the present invention, a method of forming a semiconductor structure includes providing a semiconductor substrate of a first conductivity type; forming a first photo resist over the semiconductor substrate, wherein the first photo resist comprises a first column covering a portion of the semiconductor substrate, and wherein the column is physically separated from other portions of the first photo resist; implanting a top portion of the semiconductor substrate using the first photo resist to form a pre-HVW, wherein the pre-HVW is of a second conductivity type opposite the first conductivity type; epitaxially growing a semiconductor layer on the semiconductor substrate and the pre-HVW to form an epitaxy layer; forming a second photo resist over the epitaxy layer, wherein the second photo resist includes a second column covering a portion of the epitaxy layer, and wherein the second column is physically separated from other portions of the second photo resist, and is in a same vertical position as the first column of the first photo resist; implanting the epitaxy layer using the second photo resist to form a HVW over and contacting the pre-HVW, wherein the HVW is of the second conductivity type; forming a third photo resist over the epitaxy layer, wherein the third photo resist comprises no isolated columns directly over the HVW; implanting a top portion of the HVW to form a field ring of the second conductivity type; forming an insulation region over and contacting the field ring and a portion of the HVW; forming a gate electrode over a portion of the insulation region; and implanting the epitaxy layer to form a source and drain on opposite sides of the gate electrode.

By using the embodiments of the present invention, the on-resistances of the high voltage MOSFETs are reduced and the breakdown voltages of the devices are increased. The stability of the ultra-high voltage MOSFETs is also improved. Advantageously, the embodiments of the present invention do not require additional masks.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel high-voltage metal-oxide-semiconductor field-effect transistor (MOSFET) having a reduced on-resistance, an increased breakdown voltage, an increased stability, and the method of forming the same are provided. The manufacturing process of this device is detailed in the following paragraphs. Throughout the various views and illustrative embodiments of the present invention, like reference numbers are used to designate like elements.

Figure 1A:
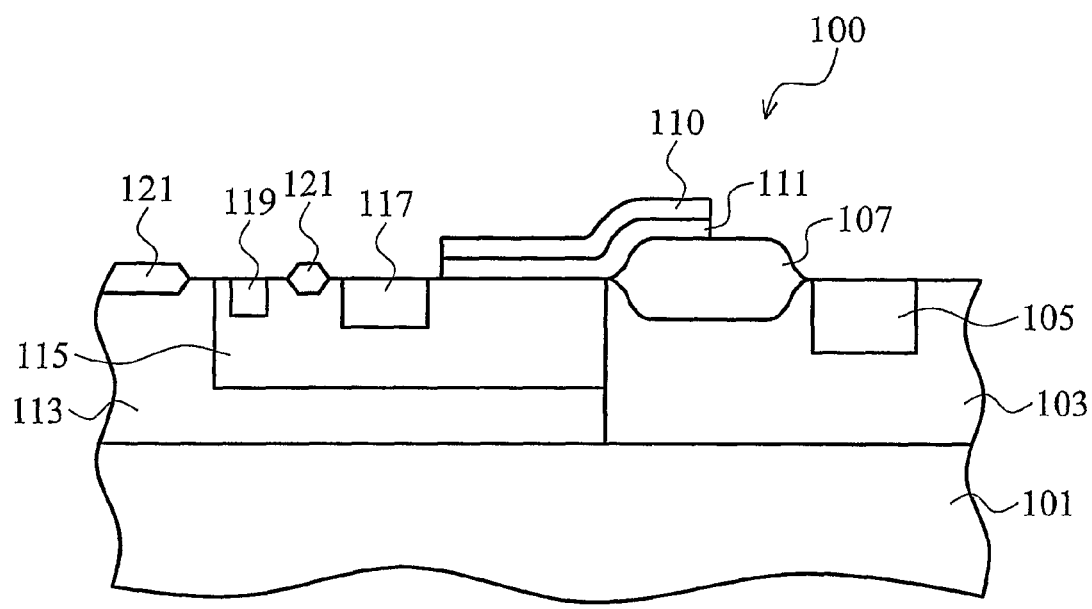
FIG. 1A is a cross-sectional view of a conventional ultra-high-voltage metal-oxide-semiconductor field-effect transistor (MOSFET)
Figure 1B:
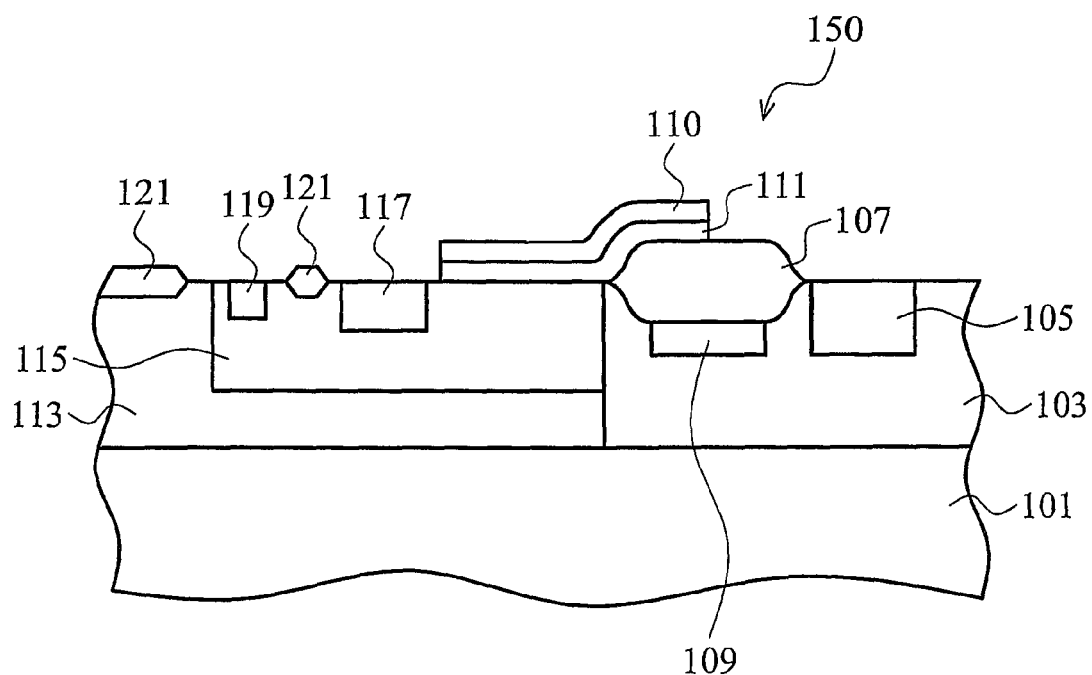
FIG. 1B is a cross-sectional view of a conventional ultra-high voltage MOSFET having a field ring.
Figure 2:
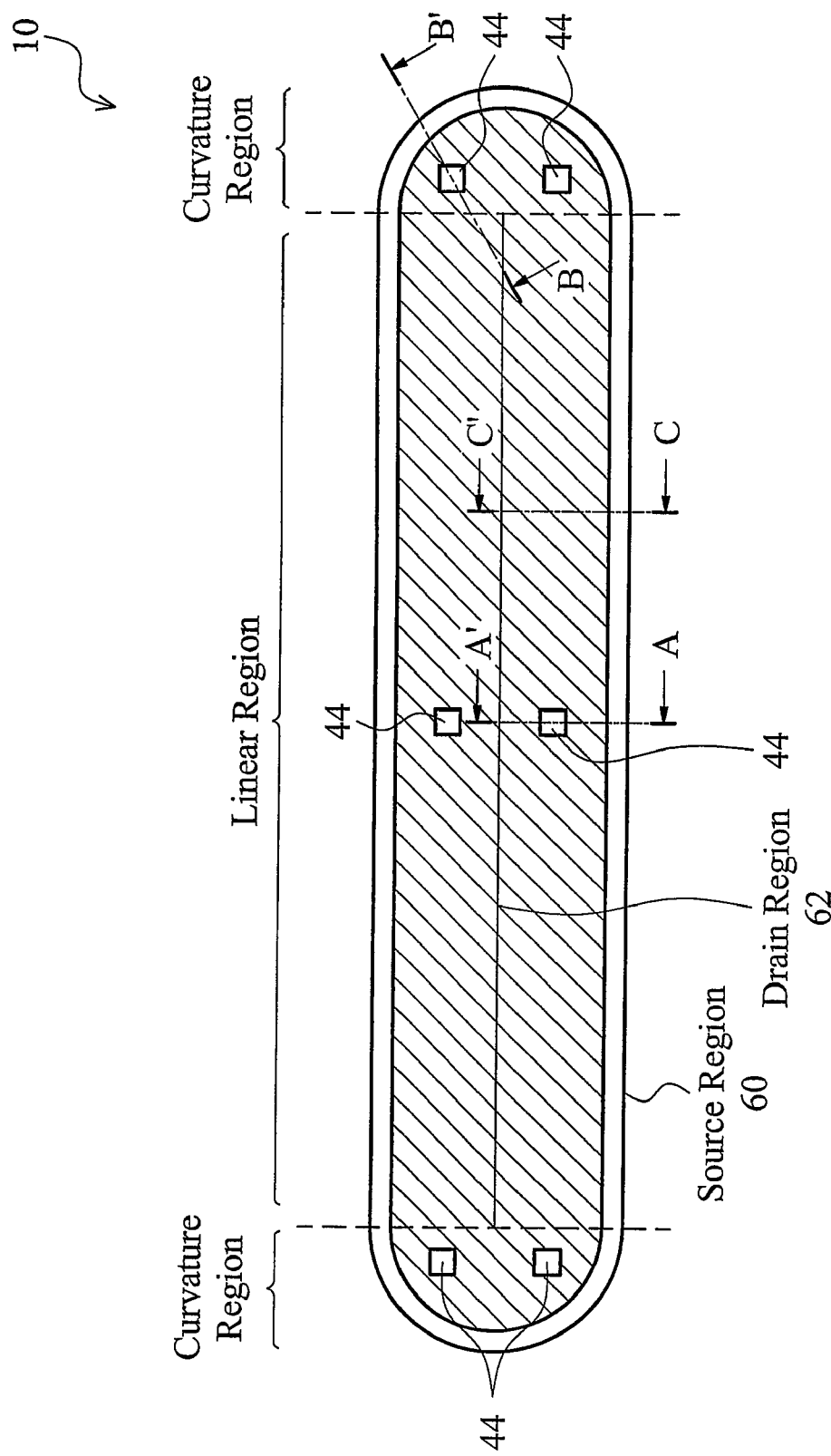
FIG. 2 illustrates a top view of an embodiment of the present invention.

FIG. 2 illustrates a top view of UHV MOSFET 10. For a clearer view, only select components are illustrated. The remaining components may be found in cross-sectional views, such as what are shown in FIG. 3H. MOSFET 10 includes a linear region and curvature regions at the ends of the linear region. The shaded regions are portions of pre-high-voltage n-well region (pre-HVNW) 24 and HVNW region 34 (also refer to FIG. 3H). Drain region 62 is formed at the center of, and encircled by, pre-HVNW region 24 and HVNW region 34. Source region 60 surrounds pre-HVNW region 24 and HVNW region 34, and forms a closed loop. Typically, UHV MOSFET 10 occupies a big area, and hence the source region 60 and drain region 62 are narrow compared to the length and the width of UHV MOSFET 10. Accordingly, each of the source region 60 and drain region 62 is shown using only a line. However, each of them may actually have a width of several microns, for example.

UHV MOSFET 10 includes one or more tunnels 44, which form paths electrically connecting field ring 46 (refer to FIG. 3H) to semiconductor substrate 20. The formation of UHV MOSFET 10 and the function of tunnels 44 are discussed as follows.

Figure 3A:
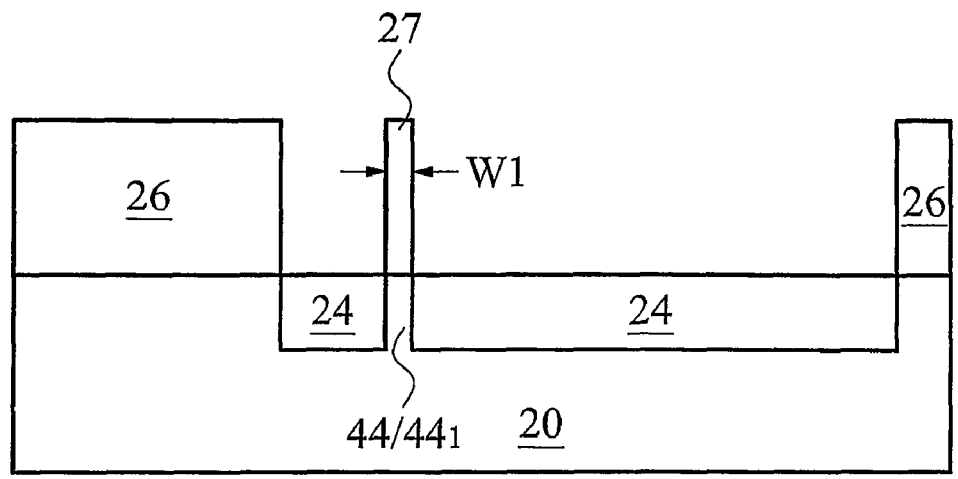
FIGS. 3A through 3I are cross-sectional views of intermediate stages in the formation of the embodiments shown in FIG. 2, wherein the cross-sectional views are taken in planes crossing line A-A' and B-B' in FIG. 2.
Figure 3B:
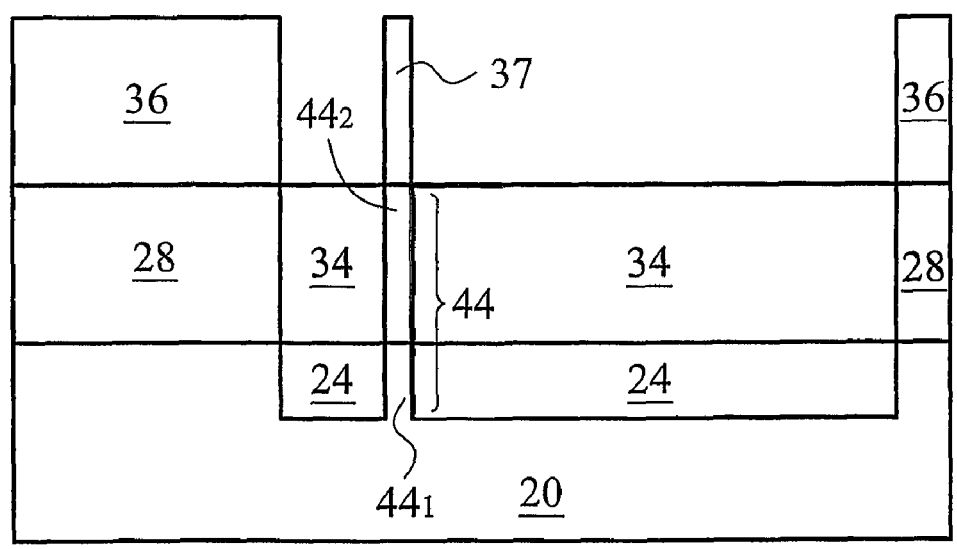
Figure 3C:
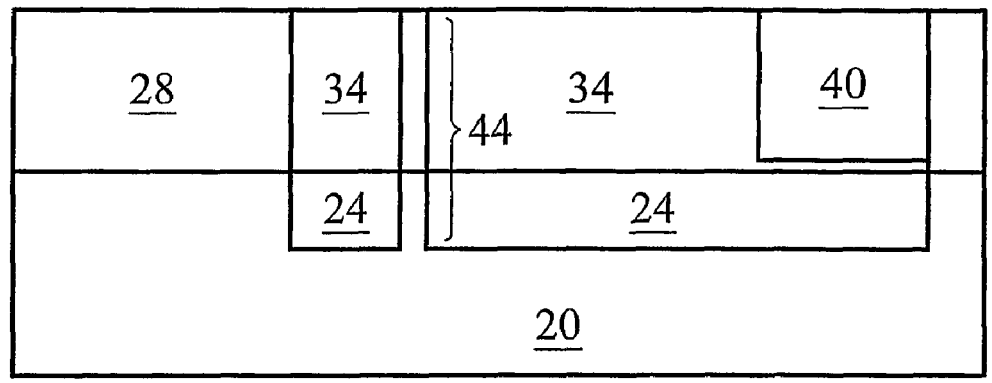
Figure 3D:
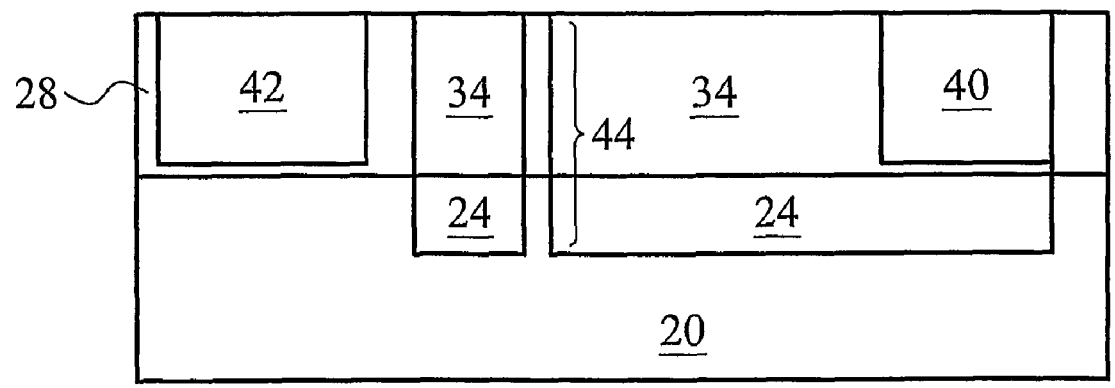
Figure 3E:
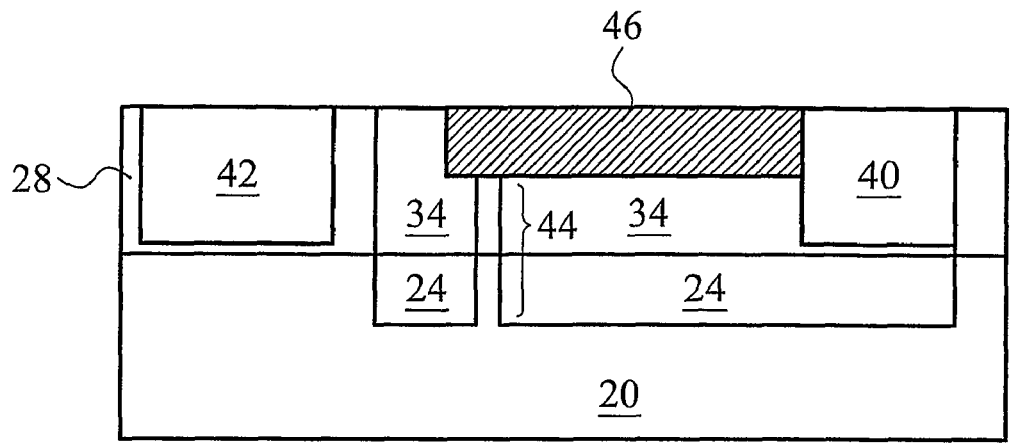
Figure 3F:
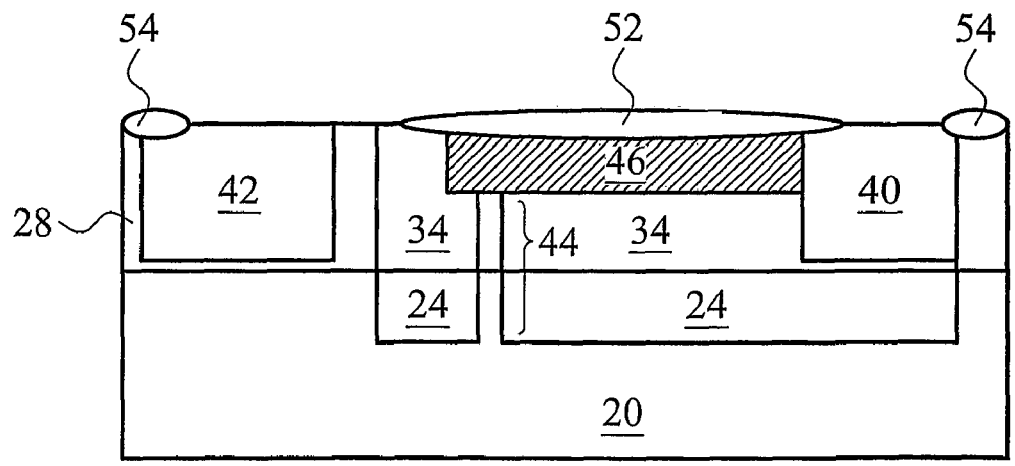
Figure 3G:
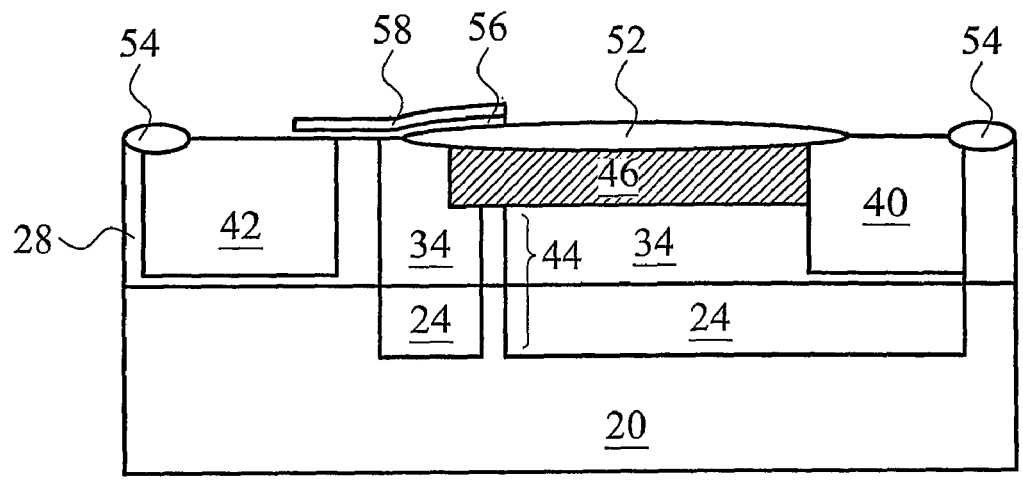
Figure 3H:
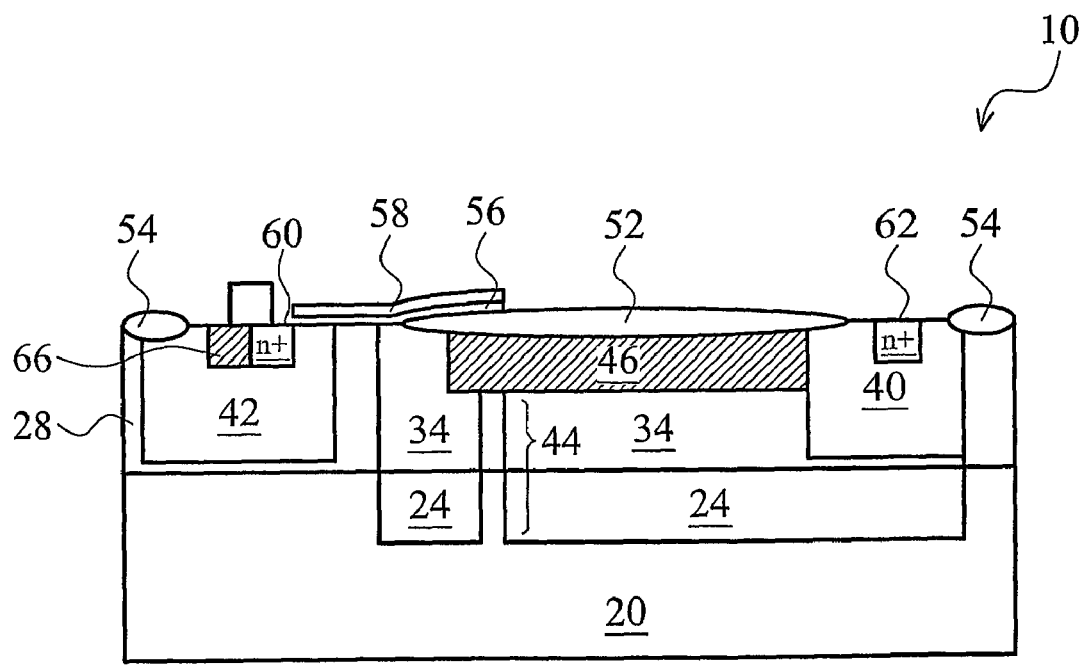

FIGS. 3A through 3H illustrate cross-sectional views of intermediate stages in the formation of UHV MOSFET 10, wherein the cross-sectional views are taken along a plane cross line A-A' or B-B' in FIG. 2. Referring to FIG. 3A, semiconductor substrate 20 is provided. Semiconductor substrate 20 preferably includes silicon, and is lightly doped with a p-type impurity. However, other commonly used semiconductor materials such as SiGe may also be used. Pre-HVNW region 24 is formed in a top portion of substrate 20, and may be formed by implanting n-type dopants, such as phosphorous, into the upper region of substrate 20. Photo resist 26 is used as a mask in the implantation. Other n-type dopants, such as arsenic, antimony, combinations thereof, or the like, may alternatively be used. In an exemplary embodiment, a dosage of the implantation is between about $1 \times 10^{10}/cm^2$ and about $1 \times 10^{16}/cm^2$. Pre-HVNW region 24 preferably has a thickness of between about 2 μm and 10 μm, and more preferably about 8.5 μm, for example. It is realized, however, the dimensions recited throughout the description are merely examples, and may change if different forming technologies are used. After the formation of pre-HVNW region 24, photo resist 26 is removed.

In an embodiment, photo resist 26 leaves pre-HVNW region 24 open, except one or more isolated photo resist columns 27 are left to cover substrate 20. The exposed portions of semiconductor substrate 20 are converted to n-type by the implant, forming pre-HVNW region 24. The portion of substrate 20 covered by photo resist column 27 forms a bottom part $44_1$ of tunnel 44.

It is realized that the n-type impurity implanted into pre-HVNW region 24 will diffuse into tunnel portion $44_1$ in subsequent high temperature processes. To ensure at least a center portion of tunnel $44_1$ is not converted to n-type by the diffusion, and a p-type path remains to link the top and the bottom of pre-HVNW region 24, photo resist column 27 preferably has a great width W1. In an exemplary embodiment, width W1 is greater than about 6 μm, and preferably between about 2 μm and about 100 μm. It is realized that the minimum width W1 required for forming p-type tunnel 44 is related to the p-type impurity concentration in p-type substrate 20, and the concentration of the implanted n-type impurity in pre-HVNW region 24.

FIG. 3B illustrates doped semiconductor layer 28 being formed over substrate 20 and pre-HVNW region 24. The doped semiconductor layer 28 comprises a semiconductor material such as silicon, and may be grown epitaxially. Accordingly, the doped semiconductor layer 28 is alternatively referred to as epitaxy layer 28. The thickness of doped semiconductor layer 28 may be greater than about 8.5 μm. Preferably, semiconductor layer 28 is in-situ doped with a p-type impurity while the epitaxial growth proceeds.

FIG. 3B also illustrates the formation of high-voltage n-well (HVNW) region 34 using photo resist 36. HVNW region 34 may be formed by implanting an n-type dopant such as phosphorous, arsenic, antimony, or the like. Preferably, the concentration of HVNW region 34 is greater than the impurity concentration of pre-HVNW region 24, and may be formed using a dosage between about $1\times10^{10}/cm^2$ and about $1\times10^{16}/cm^2$. Alternatively, HVNW region 34 and pre-HVNW region 24 have substantially the same impurity concentration. In an embodiment, the thickness of HVNW region 34 is preferably substantially equal to the thickness of epitaxy layer 28, and hence HVNW region 34 adjoins pre-HVW region 24.

Tunnel 44 needs to extend into HVNW region 34. Therefore, photo resist 36 has an isolated photo resist column 37 vertically aligned to tunnel portion $44_1$. As a result, tunnel portion $44_2$ is formed in HVNW region 34, which tunnel portion $44_2$ does not receive direct implanting. Tunnel portion $44_2$ again is preferably wide enough, and hence after the subsequent diffusion processes, at least a center portion of tunnel portion $44_2$ is not converted to n-type. Preferably, photo resist 36 is formed using a same mask (for defining lithography patterns) as for forming photo resist 26. Accordingly, tunnel portion $44_2$ is vertically aligned to, and electrically connected to, tunnel portion $44_1$. If, however, process variation occurs, tunnel portions $44_1$ and $44_2$ may be misaligned, but still have overlapping. This may also occur if different masks are used to form photo resists 26 and 36.

FIG. 3C illustrates the formation of n-well 40. Preferably, n-well 40 is formed by forming a photo resist (not shown), and implanting an n-type impurity, for example, to a concentration greater than that of HVNW region 34. In an exemplary embodiment, the dosage of the implantation is between about $1\times10^{10}/cm^2$ and about $1\times10^{16}/cm^2$. N-well 40 preferably has a bottom surface higher than the bottom surface of HVNW region 34. Alternatively, the bottom surface of n-well 40 may be level with, or lower than, the bottom surface of HVNW region 34.

FIG. 3D illustrates the formation of p-well region 42. Preferably, p-well region 42 is formed adjacent to HVNW region 34. In an embodiment, p-well region 42 is spaced apart from HVNW region 34, as shown in FIG. 3D. In alternative embodiments, p-well region 42 adjoins HVNW region 34 such that a junction between the two wells is created. P-well region 42 may be formed by forming a photo resist (not shown), and implanting a desired portion of the P-epi layer 28 with a p-type dopant such as boron, indium, or the like. An exemplary dosage of the implantation is between about $1\times10^{10}/cm^2$ to about $1\times10^{16}/cm^2$. In an embodiment, p-well region 42 has a depth of between about 2 μm and about 6 μm, with a preferred depth of about 4 μm.

FIG. 3E illustrates the counter-doping of a portion of n-well 34 with a p-type dopant to form counter-doped region 46. In an embodiment, counter-doped region 46 has a ring shape (refer to FIG. 2, and counter-doped region 46 forms a ring encircling drain region 62), and hence is alternatively referred to as field ring 46 throughout the description. Field ring 46 may be formed by doping a top portion of the HVNW region 34 with a p-type dopant to a depth smaller than the depth of HVNW region 34. The thickness of field ring 46 is great enough, so that after the subsequent formation of field dielectric 52 as shown in FIG. 3F, there are still remaining portions of field ring 46 under field dielectric 52. An exemplary depth of field ring 46 is between about 0.4 μm to about 2 μm, and preferably about 1 μm. The bottom of field ring 46 is spaced apart from the bottom of HVNW region 34. Field ring 46 may adjoin, or be spaced apart from, n-well region 40. Further, the bottom of field ring 46 is in contact with tunnel 44, so that tunnel 44 electrically connects field ring 46 and semiconductor substrate 20.

FIG. 3F illustrates the formation of insulator 52 over a portion of HVNW region 34. Additional insulator 54 may be formed over portions of the p-well region 42 and P-epi layer 28, and the like. Insulators 52 and 54 may be formed using local oxidation of silicon (LOCOS), or may be shallow trench isolation (STI) regions.

FIG. 3G shows the formation of gate dielectric 56 and gate electrode 58. Gate dielectric 56 is deposited over an upper portion of field dielectric 52 and extends to cover a portion of p-well region 42. Gate electrode 58 is deposited over gate dielectric 56. Gate electrode 58 is conductive and may be formed using doped polysilicon, metal, metal alloy, or the like. In the case gate electrode 58 comprises polysilicon, a surface of the gate electrode 58 may be silicided.

FIG. 3H illustrates the formation of source region 60 in p-well region 42, and drain region 62 in n-well 40. Source region 60 and the drain region 62 can be formed by implanting an n-type dopant such as phosphorous to a concentration of between about $1\times10^{19}/cm^3$ and about $2\times10^{20}/cm^3$, as an example. Pickup region 66, which is of p-type, is formed in p-well region 42, with an exemplary concentration of between about $1\times10^{19}/cm^3$ and about $2\times10^{20}/cm^3$.

The structure shown in FIG. 3H will experience various steps having thermal budgets. For example, a well drive-in process (with an elevated temperature, for example, about 1000° C.) may be performed between steps shown in FIGS. 3E and 3F. Further, the integrated circuit manufacturing process and packaging processes include other high-temperature steps. Accordingly, the impurities in directly implanted regions 24 and 34 will diffuse to tunnels $44_1$, $44_2$, respectively. After all thermal budgets in the integrated circuit manufacturing process and packaging processes, the resulting structure is similar to what is shown in FIG. 3G, except the diameter of tunnel 44 is reduced due to the conversion of the outer portion of tunnel 44 into n-type. An inner portion of tunnel 44 remains to be of p-type.

Figure 3I:
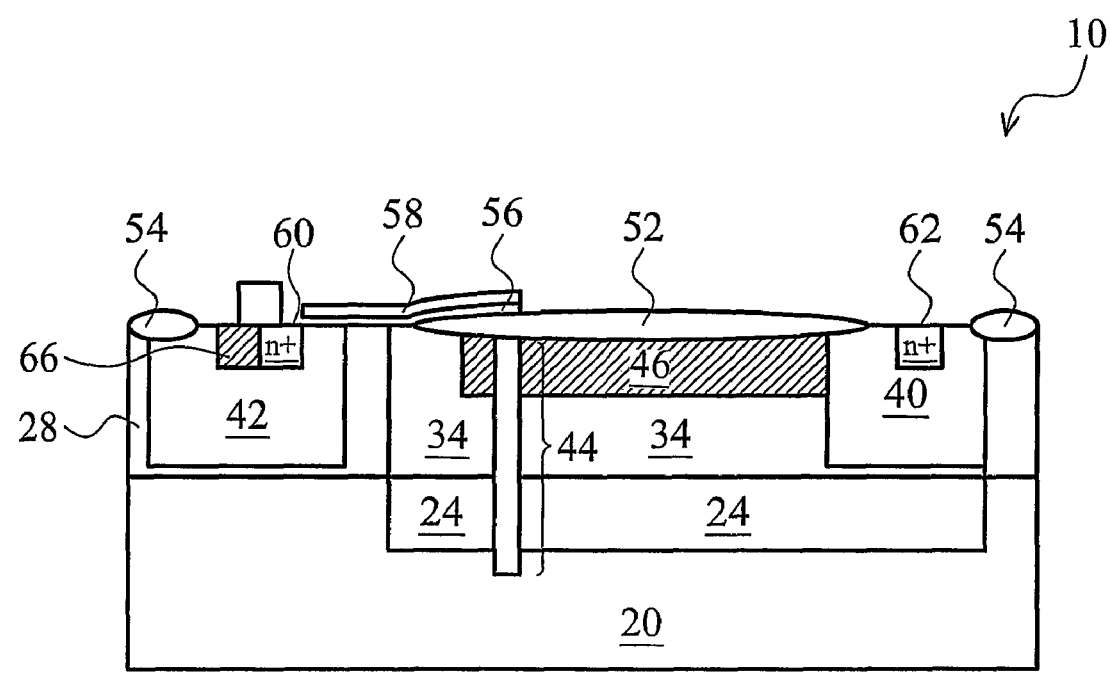

FIG. 3I illustrates an alternative embodiment of the present invention. In this embodiment, the initial steps are similar to what are shown in FIGS. 3A through 3E, except no tunnel(s) 44 are formed in pre-HVNW region 24 and HVNW region 34. After the structure as shown in FIG. 3E is formed, a photo resist (not shown) is formed, with an opening(s) exposing portions of field ring 46. An implantation is performed to form p-type tunnel 44 through the opening. Tunnel 44 extends from the top surface of field ring 46 to the bottom surface of pre-HVNW region 24, as is shown in FIG. 3I. In this case, the p-type impurity concentration in the portion of tunnel 44 in field ring 46 is higher than the p-type impurity concentration in the remaining portions of field ring 46. To ensure there is no broken point between field ring 46 and semiconductor substrate 20, the implantation may include several implants with different energies. The bottom of tunnel 44 is preferably lower than the bottom of pre-HVNW region 24 to allow some margin. After the formation of tunnel 44, the steps shown in FIGS. 3F through 3G may be performed to finish the formation of UHV MOSFET 10.

Figure 4:
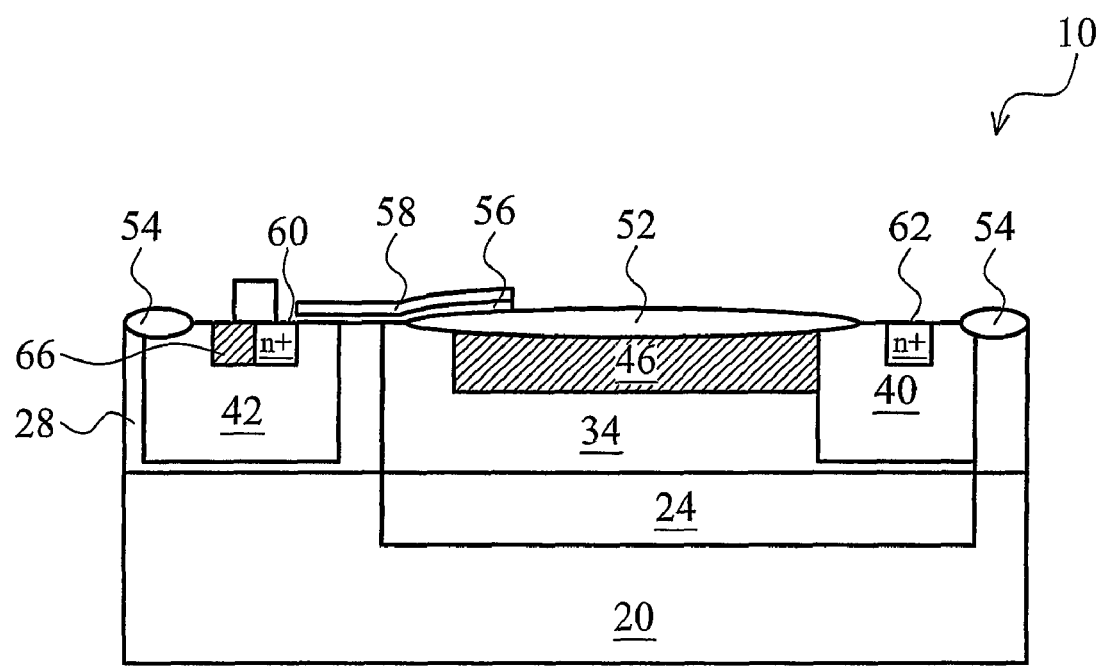
FIG. 4 is a cross-sectional view of the embodiment shown in FIG. 2, wherein the cross-sectional view is taken in a plane crossing line C-C' in FIG. 2.

FIG. 4 illustrates another cross-sectional view of UHV MOSFET 10 in FIG. 2, wherein the cross-sectional views are taken along planes crossing line D-D'. In this cross-sectional view, no tunnel is shown.

Figure 5:
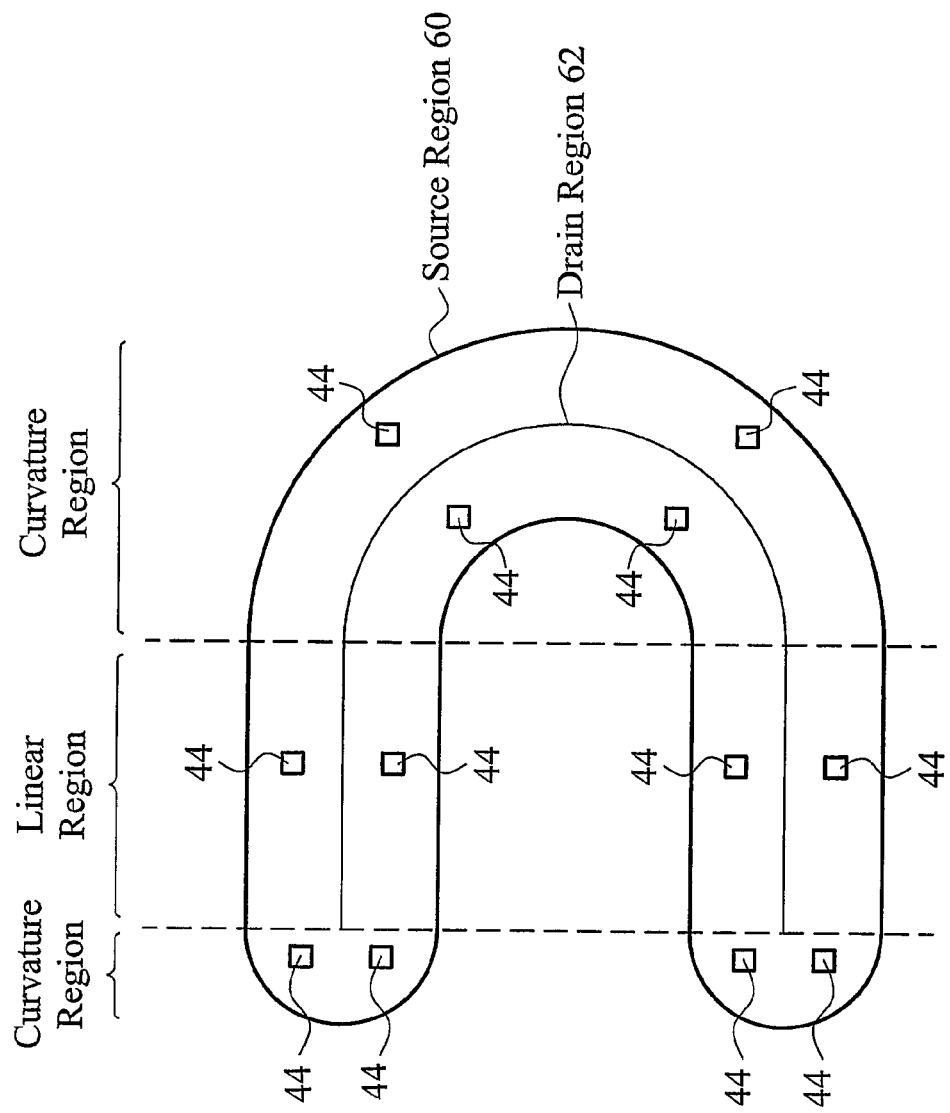
FIG. 5 illustrates a top view of an alternative embodiment of the present invention, wherein the drain region of a ultra-high voltage MOSFET has a U-shape.

Preferably, UHV MOSFET 10 includes more than one tunnel 44, as is shown in FIG. 2. The desirable number of tunnels 44 depends on the size of UHV MOSFET 10, and the greater the size of UHV MOSFET 10, the more tunnels are preferred. The tunnels 44 are preferably distributed substantially evenly across field ring 46. Tunnel 44 may have any shape in the top view, including squares, rectangles, circles, octagons, or the like. The embodiments of the present invention may be applied to MOSFETs having other shapes. For example, FIG. 5 illustrates another type of UHV MOSFET 10, whose drain region 62 has a U-shape, and the respective MOSFET 10 is referred to as having a horseshoe shape. This device is similar to bending the device shown in FIG. 2, until the ends of drain region 62 are parallel to each other. Again, p-type tunnels 44 are formed to connect field ring 46 and substrate 20 (not shown in FIG. 5, the cross-sectional views are essentially the same as shown in FIG. 3H/3I and FIG. 4).

Figure 6:
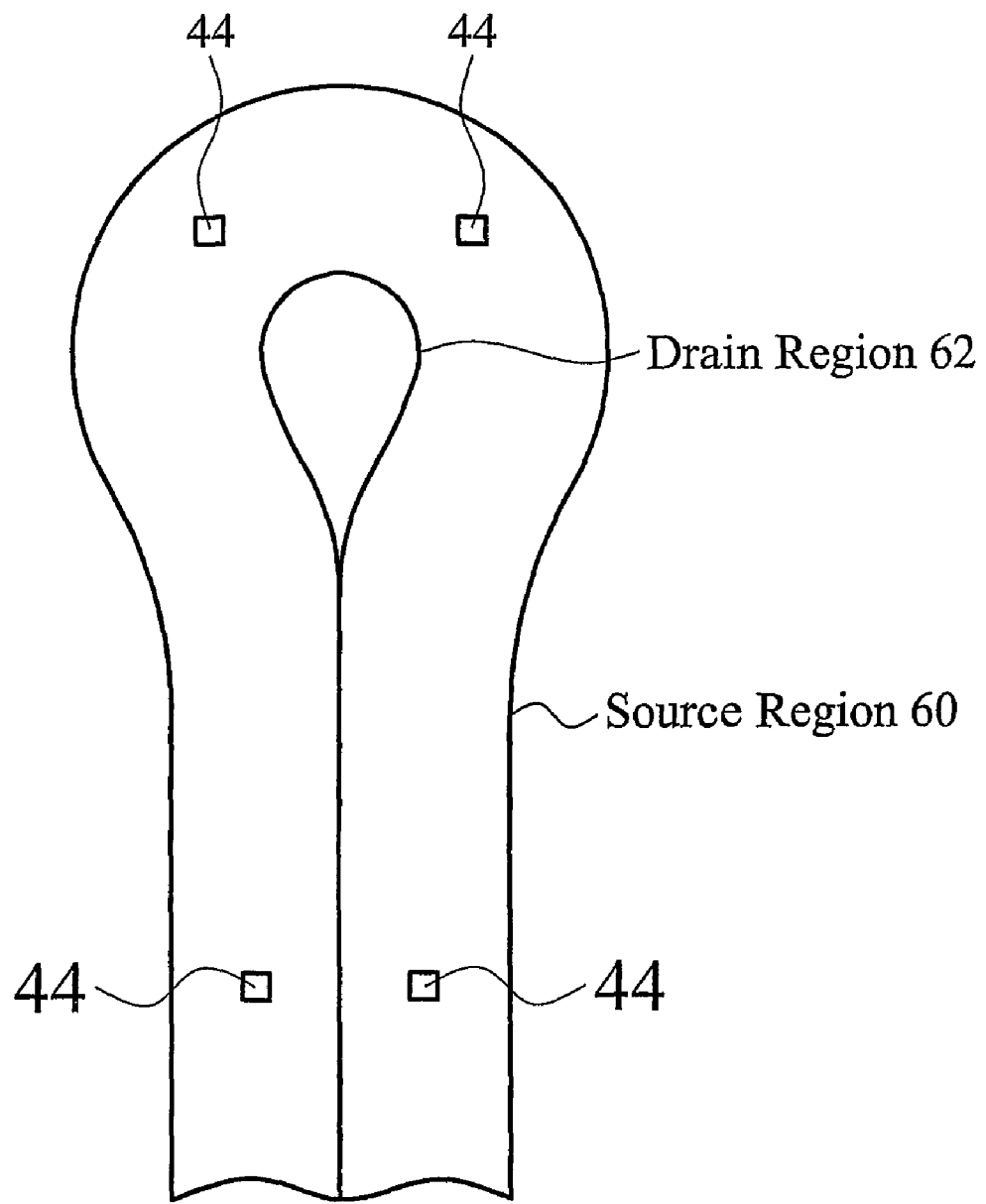
FIG. 6 illustrates a top view of yet another embodiment of the present invention, wherein tunnels are formed as circles.

FIG. 6 illustrates yet another UHV MOSFET 12, which includes source 60 and drain 62. The drain 62 and source 60 both form arcs at the end. In this embodiment, p-type tunnels 44 are formed to connect field ring 46 and substrate 20 (not shown, the cross-sectional views are essentially the same as shown in FIG. 3G and FIG. 4). It is to be noted that tunnels 44 may be formed in any other type of high-voltage MOSFETs having any other shapes, even if their breakdown voltages are only less than about 100 volts, for example, the commonly known rectangular high-voltage MOSFETs.

Figure 7:
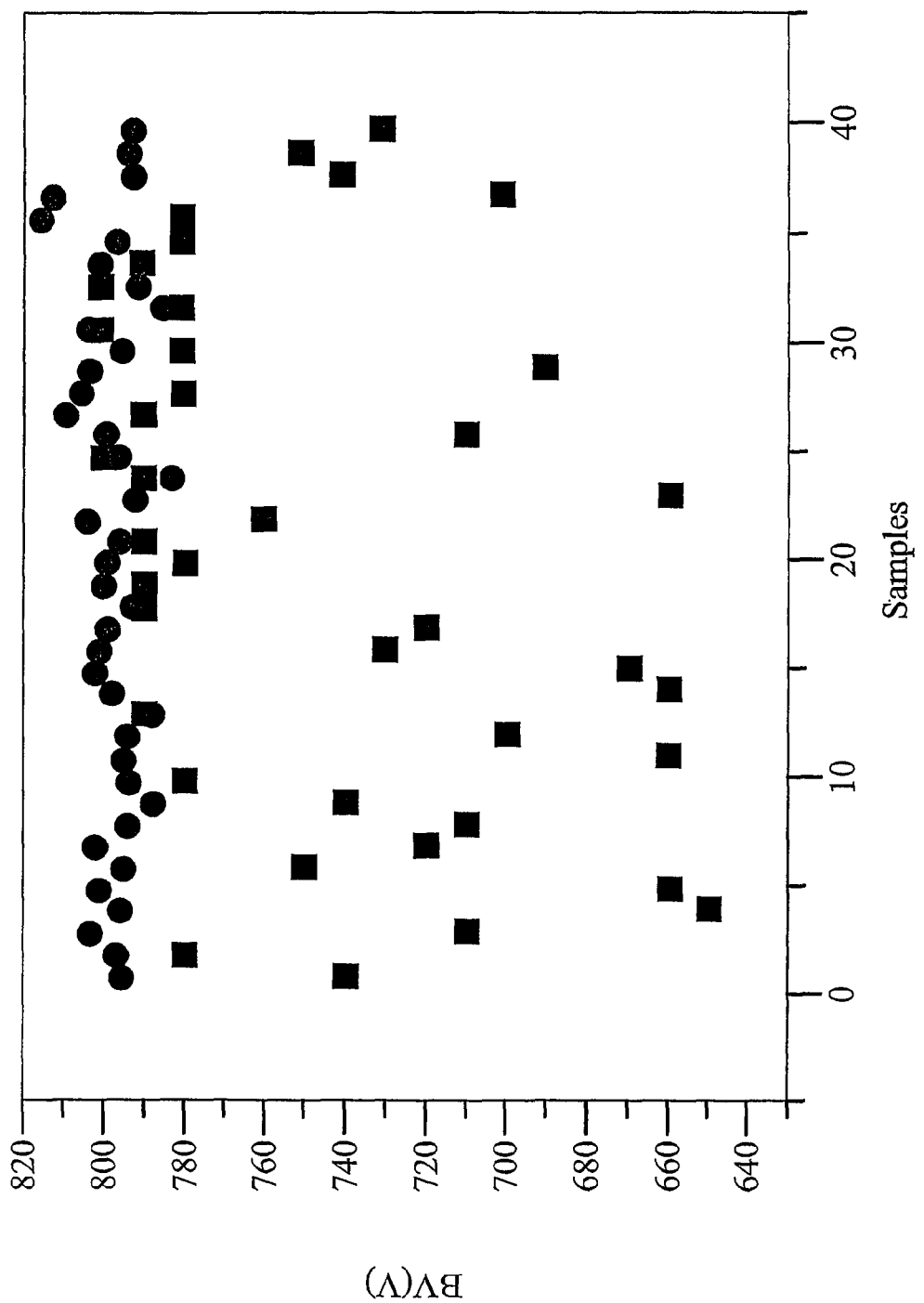
FIG. 7 illustrates breakdown voltages of a plurality of samples, wherein the results obtained from the embodiments of the present invention are compared to the results obtained from conventional sample ultra-high voltage MOSFETs.

FIG. 7 illustrates experiment results comparing the performance of the embodiments of the present invention to conventional high-voltage MOSFETs. Two groups of samples are tested. The first group of samples has the structure shown in FIG. 3H, while the second group of samples has a structure similar to what is shown in FIG. 3H, except no tunnel 44 is formed. The X-axis indicates the number of samples, while the Y-axis shows the breakdown voltages of the samples. It is noted that the breakdown voltages of the first groups of samples (represented by circles) are stably greater than about 800 volts, while the breakdown voltages of the second group of samples (represented by squares) ranges widely between about 650 volts and about 800 volts.

Figure 8:
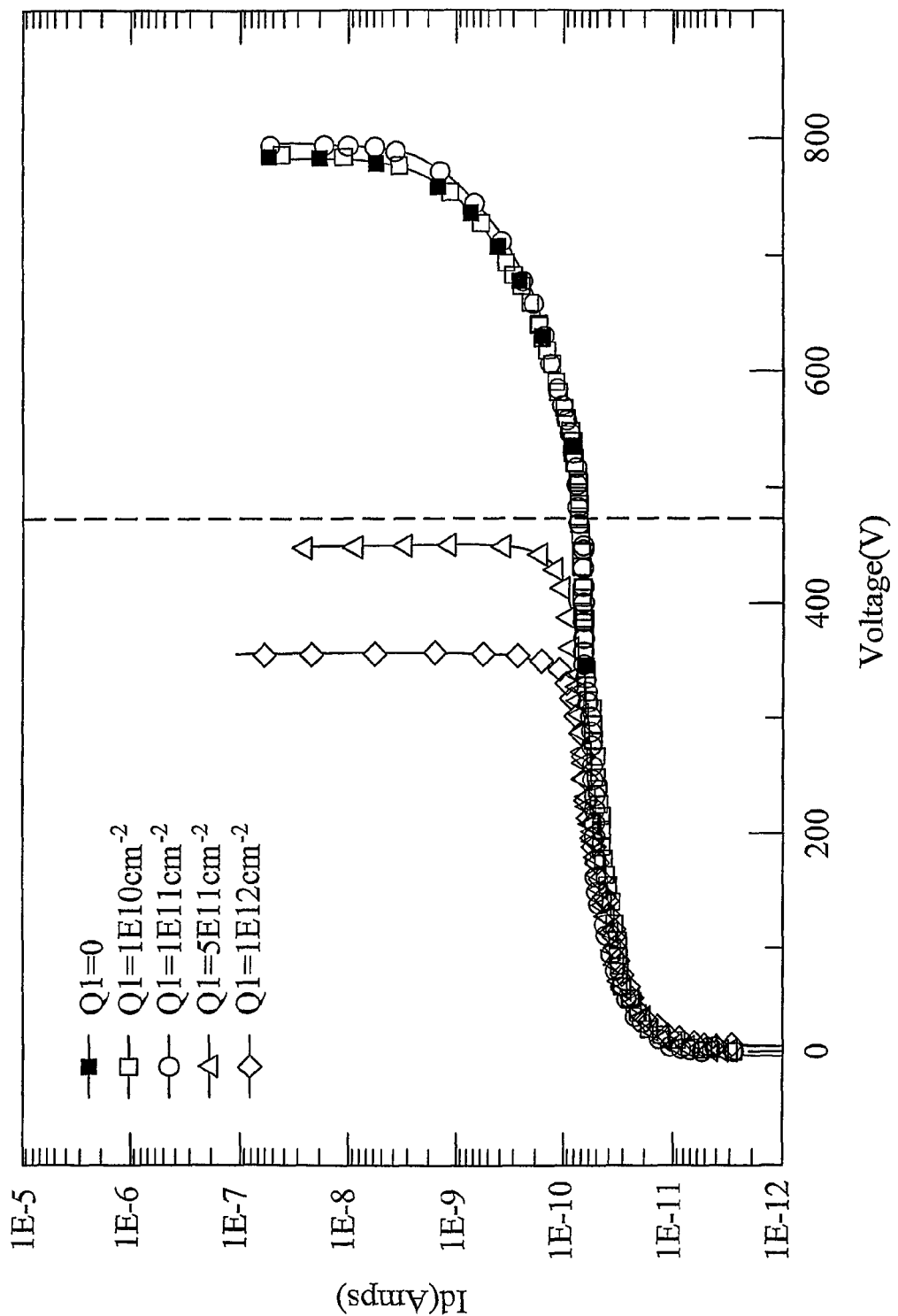
FIG. 8 shows simulation results indicating the relationship between the amount of charges trapped in the field rings and the breakdown voltages of the respective devices.

The mechanism of the improvement in the breakdown voltages of the UHV MOSFET embodiments of the present invention is not clear. One of the possible explanations is that due to the ultra high voltages applied on the MOSFETs, a high ionization rate of atoms is resulted by high-energy impacts. This causes excess charges to be generated in field rings 46. However, since field ring 46 in a conventional UHV MOSFET is electrically floating due to the back-to-back diodes formed between field ring 46 and semiconductor substrate 20, the excess charges cannot be discharged, and hence causing the degradation in the performance of the respective UHV MOSFET. The p-type tunnel 44 electrically connects the p-type field ring 46 and the p-type semiconductor substrate 20, so that excess charges may be discharged. FIG. 8 illustrates simulation results to confirm the effect of excess charges, wherein the drive currents Id of the simulated UHV MOSFETs are shown as a function of drain-to-source voltages. Different amount of excess charges were injected into field rings in the simulation, and the I-V curves of the respective UHV MOSFETs are simulated. It is noted that with the increase in the amount of charges in field rings 46, the breakdown voltages decrease, and hence proving the adverse effect of the excess charges.

As one of ordinary skill in the art will appreciate, embodiments as presented herein are merely illustrative embodiments of the present invention. For example, while the discussed embodiment is an n-type UHV MOSFET, other embodiments could be p-type UHV MOSFETs, with the conductivity types of source/drain regions, high-voltage well regions, pre-HVNW region, well-regions, substrate, tunnels, and the like, inverted.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A semiconductor structure comprising:
a semiconductor substrate of a first conductivity type;
a pre-high-voltage well (pre-HVW) in the semiconductor substrate, wherein the pre-HVW is of a second conductivity type opposite the first conductivity type;
a high-voltage well (HVW) over the pre-HVW, wherein the HVW is of the second conductivity type;
a field ring of the first conductivity type occupying a top portion of the HVW; and
a tunnel of the first conductivity type in the pre-HVW and the HVW, and electrically connecting the field ring and the semiconductor substrate.

2. The semiconductor structure of claim 1 further comprising:
an insulation region over and contacting the field ring and a portion of the HVW;
a drain region in the HVW and adjacent the insulation region;
a gate electrode over a portion of the insulation region; and
a source region on an opposite side of the gate electrode than the drain region.

3. The semiconductor structure of claim 1 further comprising a plurality of tunnels of the first conductivity type connecting the field ring and the semiconductor substrate, wherein each of the plurality of tunnels is physically separated from other ones of the plurality of tunnels.

4. The semiconductor structure of claim 3, wherein the field ring forms a ring encircling the drain region, wherein the field ring comprises linear regions and curvature regions, and wherein the plurality of tunnels is distributed with first portions connected to the linear regions of the field ring and second portions connected to the curvature regions of the field ring.

5. The semiconductor structure of claim 1, wherein the pre-HVW physically contacts the HVW.

6. The semiconductor structure of claim 1, wherein the tunnel extends to a top surface of the field ring, and wherein a portion of the tunnel in the field ring has a first-conductivity-type impurity concentration higher than a first-conductivity-type impurity concentration in the field ring.

7. The semiconductor structure of claim 1, wherein the pre-HVW and the HVW have different second-conductivity-type impurity concentrations.

8. The semiconductor structure of claim 1, wherein the first conductivity type is p-type, and the second conductivity type is n-type.

9. The semiconductor structure of claim 1, wherein the first conductivity type is n-type, and the second conductivity type is p-type.

10. A semiconductor structure comprising:
a semiconductor substrate of a first conductivity type;
a pre-high-voltage well (pre-HVW) in the semiconductor substrate, wherein the pre-HVW is of a second conductivity type opposite the first conductivity type;
a high-voltage well (HVW) over and contacting the pre-HVW, wherein the HVW is of the second conductivity type;
a plurality of tunnels of the first conductivity type extending from a top surface of the HVW to a bottom surface of the pre-HVW, wherein each of the plurality of tunnels is encircled by the pre-HVW and the HVW;
a field ring in the HVW and occupying a top portion of the HVW, wherein the field ring is of the first conductivity type;
a drain region in the HVW;
an insulation region over the field ring;
a gate electrode over a portion of the insulation region; and
a source region on an opposite side of the gate electrode than the drain region, wherein the source region and the drain region are of the second conductivity type.

11. The semiconductor structure of claim 10, wherein the plurality of tunnels is underlying the field ring, and electrically connecting the field ring and the semiconductor substrate.

12. The semiconductor structure of claim 10, wherein each of the plurality of tunnels is physically separated from other ones of the plurality of tunnels.

13. The semiconductor structure of claim 10, wherein each of the plurality of tunnels has a diameter of between about 2 µm and about 100 µm.

14. The semiconductor structure of claim 10, wherein the plurality of tunnels extends through the field ring and to a top surface of the field ring, and wherein portions of the plurality of tunnels in the field ring have a first-conductivity-type impurity concentration higher than a first-conductivity-type impurity concentration in the field ring.

15. The semiconductor structure of claim 14, wherein bottoms of the plurality of tunnels are lower than a bottom surface of the pre-HVW.

16. The semiconductor structure of claim 10, wherein the HVW has a higher second-conductivity-type impurity concentration than the pre-HVW.

17. A semiconductor structure comprising:
a semiconductor substrate of a first conductivity type;
a pre-high-voltage well (pre-HVW) in the semiconductor substrate, wherein the pre-HVW is of a second conductivity type opposite the first conductivity type;
a high-voltage well (HVW) over and contacting the pre-HVW, wherein the HVW is of the second conductivity type;
a field ring of the first conductivity type in, and occupying a top portion of, the HVW, wherein each of the pre-HVW, the HVW and the field ring comprises a linear region and a curvature region;
a tunnel of the first conductivity type extending from a top surface of the HVW to a bottom surface of the pre-HVW, and physically connecting the field ring and the semiconductor substrate;
a drain region in the HVW;
an insulation region over and contacting the field ring;
a gate electrode over a portion of the insulation region; and
a source region on an opposite side of the gate electrode than the drain region, wherein the source region and the drain region are of the second conductivity type.

18. The semiconductor structure of claim 17, wherein the tunnel is in the curvature regions of the pre-HVW and the HVW.

19. The semiconductor structure of claim 17, wherein the tunnel is in one of the linear regions of the pre-HVW and the HVW.

* * * * *